(12) United States Patent
Keane

(10) Patent No.: US 9,000,828 B2
(45) Date of Patent: Apr. 7, 2015

(54) MULTIPLEXING CIRCUIT

(75) Inventor: Michael Dominic Keane, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 723 days.

(21) Appl. No.: 11/982,641

(22) Filed: Nov. 2, 2007

(65) Prior Publication Data

US 2009/0140775 A1 Jun. 4, 2009

(51) Int. Cl.
*H03K 3/01* (2006.01)
*H03K 19/00* (2006.01)
*H03F 3/345* (2006.01)
*H03K 17/00* (2006.01)

(52) U.S. Cl.
CPC ............ *H03K 19/0005* (2013.01); *H03F 3/345* (2013.01); *H03K 17/007* (2013.01)

(58) Field of Classification Search
CPC ............................... G01R 19/32; G01R 21/133
USPC .................. 327/415, 512, 513, 530, 534–543
See application file for complete search history.

(56) References Cited

U.S. PATENT DOCUMENTS

| 7,489,186 | B2 * | 2/2009 | Segarra ............................. 330/2 |
| 7,528,590 | B2 * | 5/2009 | Wei ................................ 323/282 |
| 2008/0061864 | A1 * | 3/2008 | Oberhuber ..................... 327/512 |
| 2008/0211475 | A1 * | 9/2008 | Ishii et al. ..................... 323/285 |

OTHER PUBLICATIONS

Micronas "Preliminary Data Sheet, MSP 3400D, MSP 3410D Multistandard Sound Processors" May 14, 1999, 84 pps.
Panasonic "Data Sheet, Part No. AN15862A" Jun. 2007, 8 pps.

* cited by examiner

*Primary Examiner* — Lincoln Donovan
*Assistant Examiner* — Diana J Cheng
(74) *Attorney, Agent, or Firm* — Kenyon & Kenyon LLP

(57) ABSTRACT

A multiplexing circuit comprising an converter for converting an input voltage signal to an input current signal. A plurality of first current mirrors for mirroring the input current signal. A switching unit selectively switches each first current mirror to a corresponding output.

37 Claims, 3 Drawing Sheets

MULTIPLEXING CIRCUIT

FIELD OF THE APPLICATION

The present application relates to a multiplexing circuit, and in particular to methods of maintaining the input impedance of the multiplexing circuit constant irrespective of the number of outputs selected.

BACKGROUND OF THE APPLICATION

Multiplexing circuits are well known in the art. The most common multiplexing circuits comprise resistors and switches operably coupled together for selectively switching an input to a plurality of outputs, as illustrated in the prior art multiplexing circuit 100 of FIG. 3. In FIG. 3 the number of resistors 110 required on the input 120 equals the number of selectable outputs 130. The switches 140 are controlled for selectively coupling the input 120 to the outputs 130. The operational amplifiers 150 are biased by reference voltages 160 and have a resistor 170 in a feedback path so that they operate as current-to-voltage converters. The input resistors 110 are arranged in parallel and as a consequence the overall input impedance reduces by increasing the number of outputs 130. Multiplexing circuits drive other circuits, and therefore need to have relatively high input impedance as will be appreciated by those skilled in the art. One method of maintaining the input impedance of the multiplexing circuit of FIG. 3 after increasing the number of selectable outputs is to increase the resistance value of the input resistors. However, increasing the resistance value of the input resistors requires larger resistors which occupy larger die area on an integrated circuit.

SUMMARY OF THE APPLICATION

The present application seeks to maintain the input impedance of a multiplexing circuit irrespective of the number of outputs selected.

A first embodiment provides a multiplexing circuit comprising a converter for converting an input voltage signal to an input current signal, a plurality of first current mirrors for mirroring the input current signal, and a switching unit for selectively switching each of the first current mirrors to a corresponding output.

Suitably, a current source provides a bias current signal for summing with the input current signal to form a summed current signal which is mirrored by the first current mirrors.

Suitably, a plurality of second current mirrors are provided for mirroring the bias current signal.

Suitably, each second current mirror is associated with a corresponding first current mirror.

Suitably, the first current mirrors provide mirrored summed current signals of an opposite polarity to the mirrored bias current signals provided by the second current mirrors.

Suitably, the switching unit comprises a plurality of first switches each of the first switches being associated with a corresponding first current mirror.

Suitably, the switching unit further comprises a plurality of second switches each associated with a corresponding second current mirror.

Suitably, a controller is provided and is configured for operating at least one first switch in combination with at least one second switch simultaneously such that at least one mirrored bias current signal is subtracted from one of the mirrored summed current signals to form an output current signal.

Suitably, at least one current-to-voltage converter is provided for converting the output current signal to an output voltage signal.

Suitably, the first current mirrors are configured to individually provide a mirrored bias current signal which is proportional to the bias current signal.

Suitably, each first current mirror comprises an NMOS transistor.

Suitably, the individual gates of the NMOS transistors are connected in common.

Suitably, the NMOS transistors are biased such that their drain source voltages are identical.

Suitably, each of the second current mirrors comprises a PMOS transistor.

Suitably, the PMOS transistors are biased such that their gate source voltages are identical.

Suitably, the PMOS transistors are biased such that their drain source voltages are identical.

Suitably, a controller is provided for providing a multiplexing control signal wherein the switching circuit is adapted to selectably switch the input signal to the one or more outputs in response to the multiplexing control signal.

The application also relates to a multiplexing circuit comprising a converter for converting an input voltage signal to an input current signal, a bias current source providing a bias current, a summing node connected to receive said bias current and said input current signal and provide a resulting summed current signal, a plurality of first current mirrors, each of the first current mirrors being configured to mirror the summed current signal so as to provide an individual mirrored summed current signal, a plurality of second current mirrors each of the second current mirrors being configured to mirror the bias current signal so as to provide an individual mirrored bias current signal, wherein each of the second current mirrors is associated with a corresponding one of the first current mirrors, a plurality of first switches each individual switch being associated with a corresponding one of the first current mirrors, a plurality of second switches each individual switch being associated with a corresponding one of the second current mirrors, a controller for selectably operating the first switches and the second switches to connectively combine individual mirrored summed current signals with a corresponding individual mirrored bias current signal to provide an output current signal.

The application also relates to a method of multiplexing, the method comprising the steps of converting an input voltage signal to an input current signal, mirroring the input current signal, and switching the mirrored input current signal to a corresponding output.

BRIEF DESCRIPTION OF THE DRAWINGS

The present application will now be described with reference to the accompanying drawings in which.

DETAILED DESCRIPTION OF THE DRAWINGS

Figure 1:
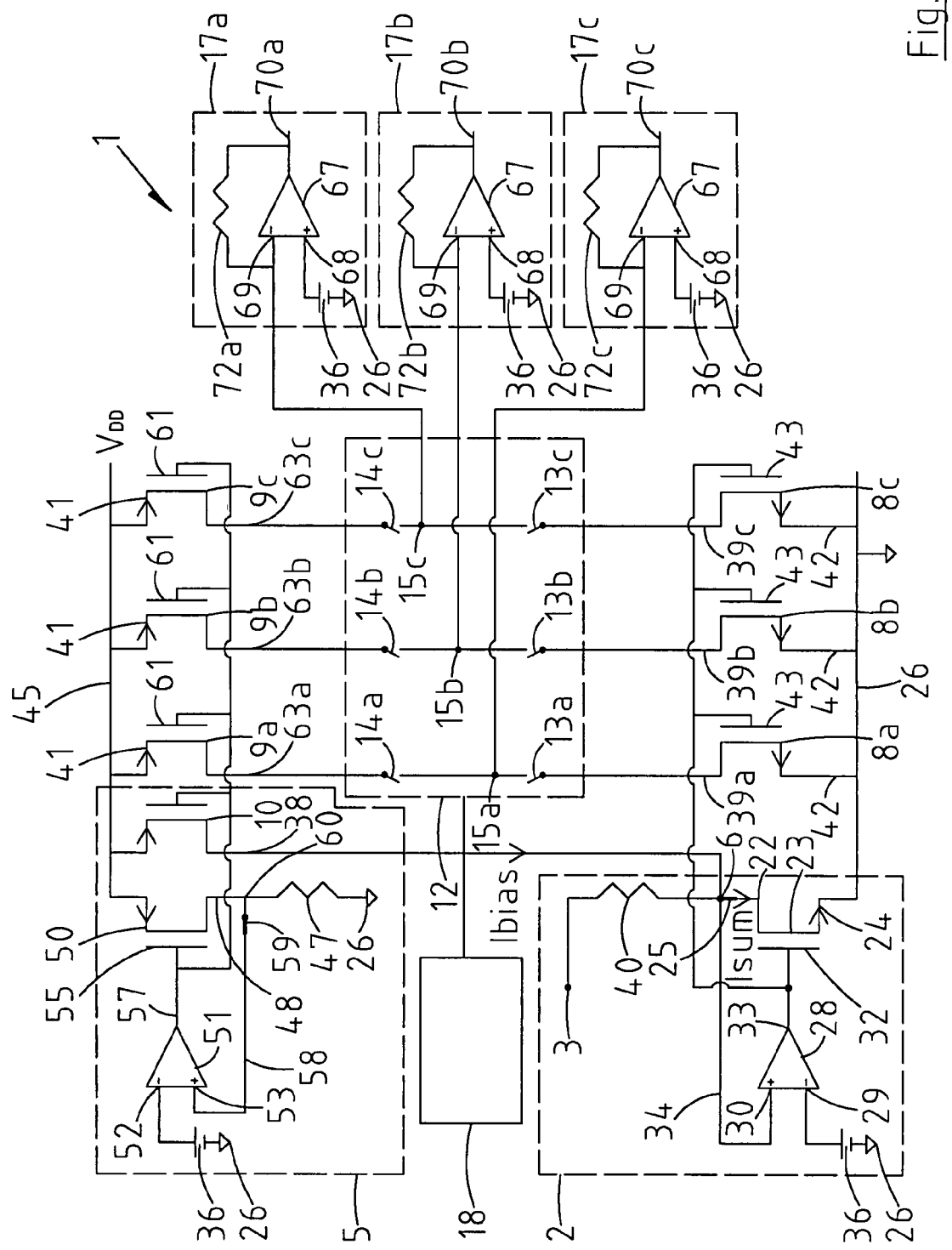
FIG. 1 is a schematic circuit diagram of a multiplexing circuit according to a first embodiment.

Referring initially to FIG. 1 there is provided an exemplary multiplexing circuit 1 switchably providing three outputs from a single input. The multiplexing circuit 1 comprises a converter, in this case, a voltage-to-current converter 2 for converting a time varying input voltage signal Vin, for example an audio signal, applied on an input node 3 to a time varying input current signal Iin. A DC bias current source 5 provides a DC bias current signal Ibias which is summed with the input current signal Iin at node 6 on the voltage-to-current converter 2 to form a summed current signal Isum. The summed current signal has the input current signal centred with respect to the DC bias current signal. A plurality of first current mirrors namely, NMOS transistors 8 mirror the summed current signal thus providing a plurality of summed current signals. The bias current signal is mirrored by a plurality of second current mirrors, namely, PMOS transistors 9 for providing a plurality of bias current signals. Each NMOS transistor 8 is associated with a corresponding PMOS transistor 9. A switching unit 12 comprising a plurality of first switches 13 and a plurality of second switches 14 selectively couple each NMOS transistor 8 to its associated PMOS transistor 9 so that the bias current signal mirrored by the PMOS transistor 9 subtracts from the summed current signal mirrored by the associated NMOS transistor 8 to form an output current signal Iout. A controller 18 coupled to the switching unit 12 generates a multiplexing control signal for selectively driving the first switches 13 and the second switches 14 in pairs.

Each first switch 13 is associated with a corresponding NMOS transistor 8, and each second switch 14 is associated with a corresponding PMOS transistor 9. As the PMOS transistors 9 provide negative current and the NMOS transistors 8 provide positive current the mirrored bias current signals will subtract from the mirrored summed current signals at summing nodes 15 common to the first switches 13 and the second switches 14 when the appropriate switches 13, 14 are closed producing output current signals equal to the original input current signal. Each output current signal is provided to a corresponding current-to-voltage converter 17 which converts the output current signal to the output voltage signal.

The voltage-to-current converter 2 comprises an input component, namely, input resistor 40 coupled between the input node 3 and a drain 22 of an NMOS transistor 23 for converting the audio input voltage signal to the input current signal. A first dummy switch 25 which is always turned on couples the input resistor 40 and the drain 22 of the NMOS transistor 23 so that the voltage dropped across the dummy switch 25 is equal to the voltage dropped across each of the first switches 13. The source 24 of the NMOS transistor 23 is coupled to an analog ground rail 26. A unity gain operational amplifier 28 having a non-inverting terminal 30 and an inverting terminal 29 drives the gate 32 of the NMOS transistor 23 through an output terminal 33. A feedback path 34 couples the non-inverting terminal 30 of the op-amp 28 to the node 6 common to the input resistor 40 and via dummy switch 25 the drain 22 of the NMOS transistor 23. A voltage reference source 36 is applied to the inverting terminal 29 of the op-amp 28. The arrangement of the feedback path 34 ensures that the op-amp 28 maintains the voltage level at node 6 equal to that of the voltage reference source 36. The time varying input current signal is equal to that of the time varying input voltage signal divided by the resistance value of the input resistor 40. The time varying input current signal is therefore derived from the time varying input voltage and not the DC voltage of the voltage reference source 36, or the DC voltage level at node 6.

$$Iin = Vin/Rin \qquad (1)$$

The value of the reference voltage source 36 is selected such that the resulting voltage level at node 6 is greater than the drain source voltage of the NMOS transistor 23 less the threshold voltage of the NMOS transistor 23 resulting in the NMOS transistor 23 being forward biased. The input current signal and the bias current signal flow through the NMOS transistor 23 from drain 22 to source 24. The drain 38 of a PMOS transistor 10 is also coupled to the node 6 for injecting the DC bias current generated by the DC current source 5 into the node 6. At node 6 the time varying input current signal sums with the injected DC bias current signal to form the summed current signal Isum.

$$Isum = Iin + Ibias \qquad (2)$$

The summed current signal flows through the NMOS transistor 23 to the analog ground rail 26, as a consequence, the feedback path 34 from node 6 forces the op-amp to drive the gate 32 of the NMOS transistor 23.

As the gates of the NMOS transistors 8 are commonly connected with the gate of transistor 23, the NMOS transistors mirror the summed current signal for producing a plurality of identical summed current signals. The NMOS transistors 8 have their sources 42 coupled to the analog ground rail 26. Suitably, the NMOS transistors 8 are designed to have substantially the same characteristics as NMOS transistor 23. For example, the two sets of transistors may be formed using the same semiconductor processing parameters, i.e. their 'Lengths', 'Widths', etc., may be substantially identical. The drain 22 of the NMOS transistor 23 is held at the value of the voltage reference source 36 due to the feedback path 34 of the op-amp 28. Because of the mirroring arrangement, the drains 39 of the NMOS transistors 8 are also held at the value of the voltage reference source 36 when the first switches 13 are closed, as discussed below. Accordingly, the drain source voltages of the NMOS transistors 8 and the NMOS transistor 23 are the same resulting in the mirrored summed current signals in each of the NMOS transistors 8 being identical to the original summed current signal in NMOS transistor 23.

The sources 41 of the PMOS transistors 9 are coupled to an analog VDD power supply rail 45. In this embodiment the bias current source 5 comprises a voltage reference 36 which is converted by a voltage-to-current converter arrangement to a current signal which is in turn mirrored. More particularly, a sense resistor 47 is coupled at one end to the analog ground rail 26 with the other end coupled to the drain 48 of a PMOS transistor 50 which has it source coupled the analog VDD rail 45. A unity gain operational amplifier 51 comprising an inverting terminal 52 and a non-inverting terminal 53 drives the gate 55 of the PMOS transistor 50 through an output terminal 57. A feedback path 58 couples the non-inverting terminal 53 of the op-amp 51 to a node 60 common to the sense resistor 47 and the drain 48 of the PMOS transistor 50. The voltage reference source 36 is applied to the inverting terminal 52 of the op-amp 51. The arrangement of the feedback path 58 ensures that the voltage level at the node 60 is substantially equal to that of the voltage reference source 36. A second dummy switch 59 in the feedback path 58 which is always turned on couples the sense resistor 47 and the non-inverting terminal 53 of the op-amp 51. This voltage drop compensates for subsequent voltage drops across each of the second switches 14. The DC bias current signal is developed across the sense resistor 47 and has a value equal to the value of the voltage reference source 36 divided by the resistance value of the sense resistor 47. The PMOS transistor 10 mirrors the DC bias current signal for applying it to node 6.

$$Ibias = Vref/Rsense \qquad (3)$$

Suitably, the PMOS transistors 9 have the same semiconductor processing parameters as the PMOS transistor 50, for example, their 'Lengths', 'Widths', etc. so that the characteristics are substantially the same. The gates 61 of the PMOS transistors 9 are also coupled to the output terminal 57 of the op-amp 51 ensuring that the gate voltages of the PMOS transistors 9 are equal to the gate voltage of the PMOS transistor 50. The drains 63 of the PMOS transistors 9 are maintained at the same voltage value as the voltage reference source 36 when the second switches 14 are closed, as discussed below. Accordingly, in this example, the mirrored current signals provided by the PMOS transistors 9, when the switches 13 and 14 are closed are identical to the bias current signal flowing through the PMOS transistor 50. As a result, the summed current output from each individual node 15 corresponds to the input current. Suitably, the individual summed current outputs are then individually provided to individual current-to-voltage converters 17 to provide individual output voltages.

In this embodiment each current-to-voltage converter 17 comprises an operational amplifier 67 with a non-inverting terminal 68, an inverting terminal 69, and an output terminal 70. A feedback resistor 72 is coupled between the inverting terminal 69 and the output terminal 70. The voltage reference source 36 is also applied to each non-inverting terminal 68. The feedback arrangement of the op-amps 67 ensures that the summing nodes 15 are held at the value of the reference voltage source 36. Accordingly, when individual first switches 13 are closed the drains 39 of corresponding NMOS transistors 8 are held at the value of the reference voltage source 36. Similarly, when individual second switches 14 are closed the drains 63 of corresponding PMOS transistors 9 are held at the value of the reference voltage source 36. The output current signals flow through the appropriate feedback resistors 72 across which a time varying output voltage Vout is developed which is centred with respect to the value of the voltage reference source 36. The operation of current-to-voltage converters are well known in the art and therefore the current-to-voltage converters 17 will not be described further.

In use, the audio input voltage signal is applied to the input node 3 which is converted by the voltage-to-current converter 2 to an input current signal. The bias current source 5 provides a DC bias current signal which is mirrored by the PMOS transistors 9. PMOS transistor 10 also mirrors the DC bias current signal so that the bias current signal is injected into node 6 where it sums with the input current signal to form a summed current signal. The summed current signal is mirrored by the NMOS transistors 8. The switches 13, 14 are driven by the controller 18 to operate in pairs such that individual bias current signals mirrored by the PMOS transistors 9 are subtracted from corresponding individual summed current signals mirrored by their associated NMOS transistors 8 at the summing nodes 15 resulting in output current signals which are equal to the original input current signal.

$$Iout = Iin \quad (4)$$

For example, when the first switch 13a and the second switch 14a are simultaneously closed as a result of the multiplexing control signal provided by the controller 18 the drain 39a of the NMOS transistor 8a is electrically coupled to the drain 63a of the PMOS transistor 9a. The output current signal Iout is then converted to an output voltage signal Vout which is available from the output terminal 70a of the current-to-voltage converter 17a. The output current signal flows through the feedback resistor 72a of the current-to-voltage converter 17a across which the output voltage signal is developed. Similarly, when the first switch 13b and the second switch 14b are simultaneously closed as a result of the multiplexing control signal provided by the controller 18 the drain 39b of the NMOS transistor 8b is electrically coupled to the drain 63b of the PMOS transistor 9b. The output current signal flows through the feedback resistor 72b of the current-to-voltage converter 17b across which the output voltage signal is developed.

$$Vout = Iout(Rfeedback) \quad (5)$$

In contrast to the prior art, there are no large changes in input impedance with the number of outputs selected.

While the mirrored biased current signals provided by PMOS transistors 9a, 9b and 9c in FIG. 1 have been described as being equal to the bias current. It will be appreciated that by scaling the Width/Length (W/L) aspect ratios of the NMOS transistors 9a, 9b and 9c relative to the W/L aspect ratio of the PMOS transistors 10 and 55 the mirrored bias current signals may be larger or smaller than the bias current signal. For example, when the W/L aspect ratio of the PMOS transistors 9a, 9b and 9c are less than that of the PMOS transistor 10 the PMOS transistors 9a, 9b and 9c provide less bias current than the PMOS transistor 10. Accordingly, when the mirrored bias current signals are subtracted from the mirrored summed current signals there is no longer full cancellation of the DC bias current. Instead the output current signals will comprise some of the DC bias current. When the output current signals flow through the feedback resistors 72 the resulting output voltage signals are no longer centred relative to the voltage reference source 36 instead they are centred with respect to a voltage value greater than the value of the voltage reference source 36. Alternatively, if the PMOS transistors 9a, 9b and 9c provide greater bias current than the PMOS transistor 10 the output voltage signals are centred with respect to a voltage value which is less than the value of the reference voltage source 36.

While the mirrored summed current signals provided by the NMOS transistors 8a, 8b and 8c in FIG. 1 have been described as being equal to the summed current signal provided by NMOS transistor 23. It will be appreciated that by scaling the W/L aspect ratios of the NMOS transistors 8a, 8b and 8c relative to the W/L aspect ratio of the NMOS transistor 23 the mirrored summed current signals may be larger or smaller than the summed current signal. Accordingly, signal gain is achieved by increasing the W/L aspect ratios of the NMOS transistors 8a, 8b and 8c compared to the W/L aspect ratio of the NMOS transistor 23.

Figure 2:
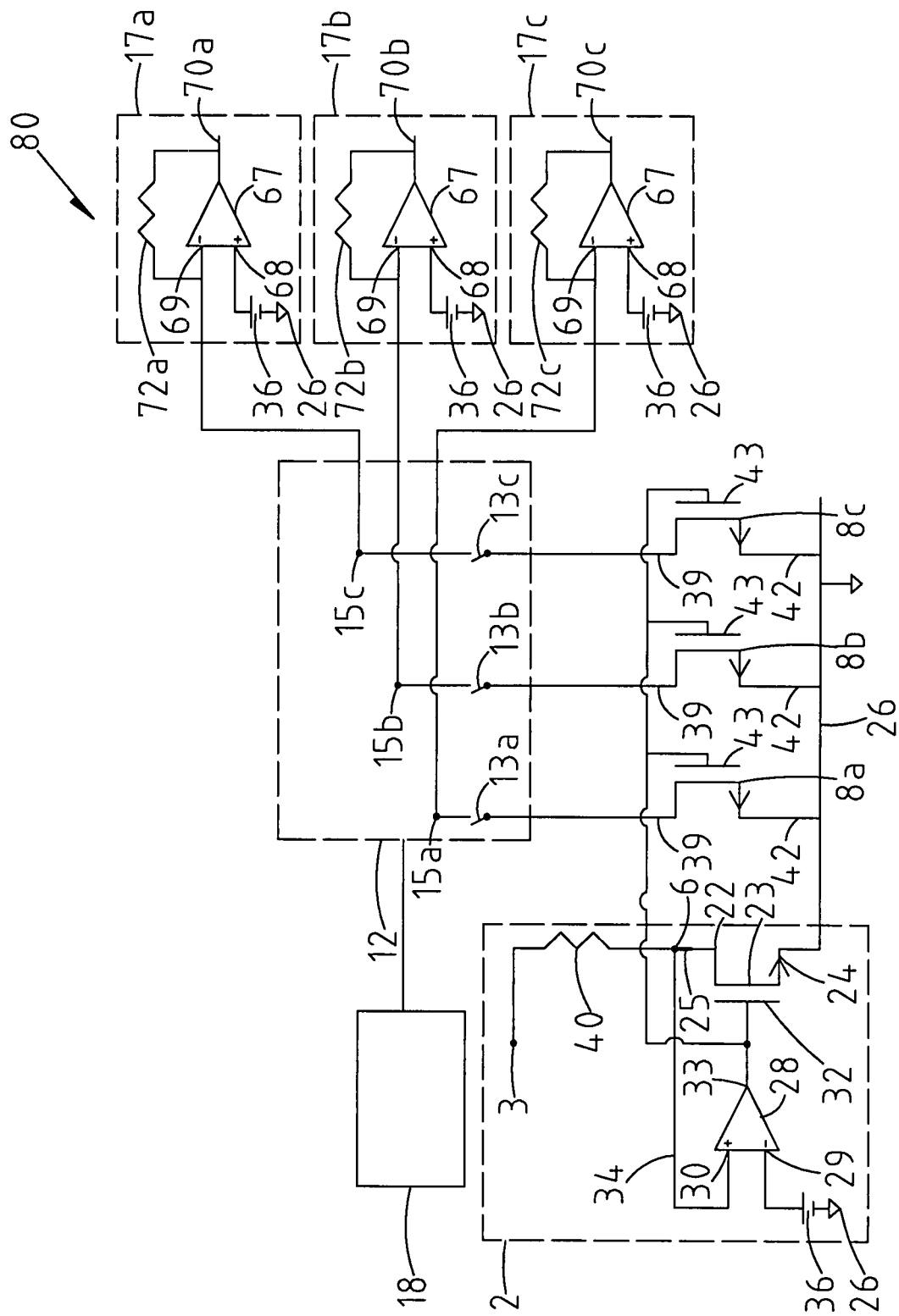
FIG. 2 is a schematic circuit diagram of a switching circuit according to another embodiment.
Figure 3:
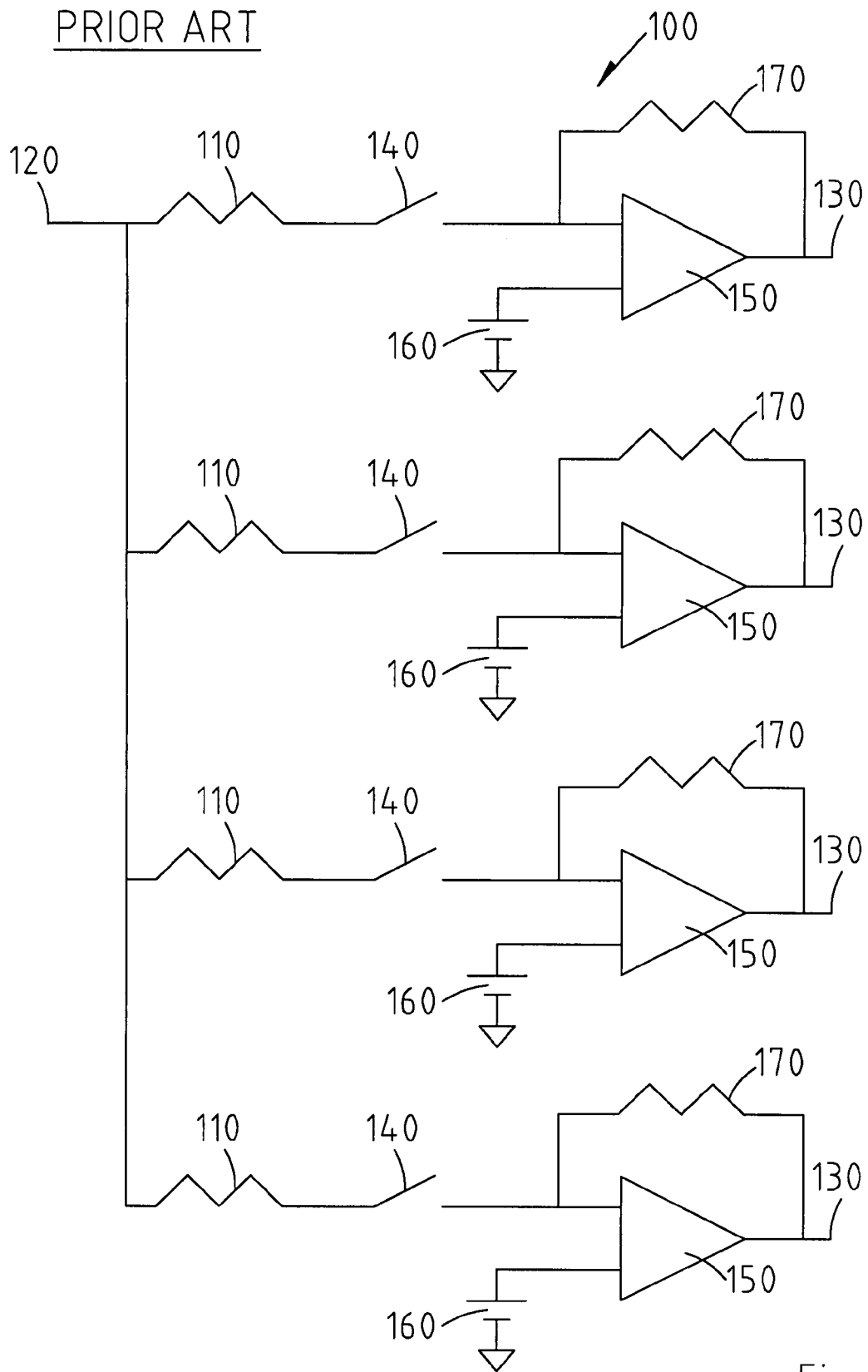
FIG. 3 is a schematic circuit diagram of a prior art multiplexing circuit.

Referring now to FIG. 2 there is illustrated another multiplexing circuit 80 which is substantially similar to the multiplexing circuit 1 and like components are indicated by the same reference numerals. The main difference between the multiplexing circuit 80 and the multiplexing circuit 1 is that the DC bias current signal is not provided in the multiplexing circuit 80. Thus, the DC bias current source 5, and the PMOS transistors 9 together with their associated second switches 14 have been removed. The time varying input voltage signal is converted to an input current signal which is mirrored by the NMOS transistors 8 to provide a plurality of time varying input current signals. Otherwise, the operation of the multiplexing circuit 80 is substantially similar to the operation of the multiplexing circuit 1.

While the application has been described with reference to some preferred embodiments thereof it will be appreciated by those skilled in the art that many modifications may be made without departing from the spirit and scope of the application. It is intended that the application should also be considered limited as shall be deemed necessary in light of the appended claims.

While only one analog time varying input voltage signal has been described, it will be appreciated that two or more input voltage signals may be applied which are summed together provided corresponding voltage-to-current converters 2 and NMOS transistors 8 are included in the circuit.

While the first current mirrors and the second current mirrors have been described as being provided by NMOS transistors and PMOS transistors, respectively, it will be appreciated that the first current mirrors and the second current mirrors may be provided by other semiconductor devices such as bipolar transistors.

The words comprises/comprising when used in this specification are to specify the presence of stated features, integers, steps or components but does not preclude the presence or addition of one or more other features, integers, steps, components or groups thereof.

The invention claimed is:

1. A multiplexing circuit comprising:
    a converter that converts an input voltage signal to an input current signal;
    a plurality of first current mirrors, each producing an individual mirrored current that mirrors one of the input current signal and a summed current signal comprising a sum of the input current signal plus a bias current signal;
    a plurality of outputs corresponding to the plurality of first current mirrors, wherein the outputs are arranged in parallel;
    a switching unit that selectively switches each of the first current mirrors to one of the outputs; and
    a plurality of current-to-voltage converters, each connected to a corresponding one of the outputs.

2. A multiplexing circuit as claimed in claim 1, further comprising a current source which provides the bias current signal that is summed with the input current signal to form the summed current signal, wherein the summed current signal is mirrored by each of the first current mirrors.

3. A multiplexing circuit as claimed in claim 2, further comprising a plurality of second current mirrors, each mirroring the bias current signal to produce an individual mirrored bias current signal.

4. A multiplexing circuit as claimed in claim 3, wherein each second current mirror is associated with a corresponding first current mirror.

5. A multiplexing circuit as claimed in claim 3, wherein the first current mirrors provide mirrored summed current signals of an opposite polarity to the mirrored bias current signals provided by the second current mirrors.

6. A multiplexing circuit as claimed in claim 3, wherein the switching unit comprises a plurality of first switches, each of the first switches being associated with a corresponding first current mirror.

7. A multiplexing circuit as claimed in claim 6, wherein the switching unit further comprises a plurality of second switches, each associated with a corresponding second current mirror.

8. A multiplexing circuit as claimed in claim 7, further comprising a controller configured to operate one of the first switches simultaneously with one of the second switches, such that one of the mirrored bias current signals is subtracted from one of the mirrored summed current signals to form an output current signal at an input of one of the current-to-voltage converters.

9. A multiplexing circuit as claimed in claim 3, wherein the second current mirrors are configured to individually provide a mirrored bias current signal which is proportional to the bias current signal.

10. A multiplexing circuit as claimed in claim 1, wherein each first current mirror comprises an NMOS transistor.

11. A multiplexing circuit as claimed in claim 1, further comprising:
    a controller providing a control signal, wherein the switching circuit performs the selective switching in response to the control signal.

12. The multiplexing circuit of claim 1, further comprising:
    an operational amplifier (op-amp), wherein each first current mirror is driven by an output of the op-amp, and a first input of the op-amp is connected to a reference voltage, and a second input of the op-amp is connected to the input current signal.

13. The multiplexing circuit of claim 12, wherein the input current signal is formed by a time-varying input voltage connected to an impedance.

14. The multiplexing circuit of claim 13, wherein the impedance is connected to a dummy switch which is always on.

15. The multiplexing circuit of claim 14, wherein the dummy switch is connected to a transistor driven by the output of the op-amp.

16. A multiplexing circuit comprising:
    a converter that converts an input voltage signal to an input current signal;
    a bias current source providing a bias current signal;
    a summing node that receives the bias current signal and the input current signal, and provides a resulting summed current signal comprising a sum of the input current signal plus the bias current signal;
    a plurality of first current mirrors, each of the first current mirrors being configured to mirror the summed current signal so as to provide an individual mirrored summed current signal;
    a plurality of second current mirrors, each of the second current mirrors being configured to mirror the bias current signal so as to provide an individual mirrored bias current signal, wherein each of the second current mirrors is associated with a corresponding one of the first current mirrors;
    a plurality of first switches, each individual first switch being associated with a corresponding one of the first current mirrors;
    a plurality of second switches, each individual second switch being associated with a corresponding one of the second current mirrors, wherein each first switch and its corresponding second switch form a switch pair that is connectable to one of a plurality of output nodes, and wherein the output nodes are arranged in parallel; and
    a controller that selectively operates the first switches and the second switches to connectively combine one of the individual mirrored summed current signals with a corresponding individual mirrored bias current signal to provide an output current signal at a selected one of the output nodes.

17. A multiplexing circuit comprising:
    a converter that converts an input voltage signal to an input current signal;
    a current source which provides a bias current signal that is summed with the input current signal to form a summed current signal;
    a plurality of first current mirrors, each of which produces an individual mirrored summed current signal that mirrors the summed current signal;
    a plurality of second current mirrors, each of which produces an individual mirrored bias current signal that mirrors the bias current signal, wherein each respective first current mirror is connected in series with a corresponding second current mirror to form pairs of first and corresponding second current mirrors and each pair of mirrors is connected in parallel;

a plurality of separate outputs, each connected to a common node of a corresponding pair of current mirrors, wherein the outputs are arranged in parallel; and a switching unit that selectively switches at least one first current mirror with at least one corresponding second current mirror so that the bias current signal mirrored by the second current mirror combines with the summed current signal mirrored by the first current mirror to form a corresponding output current signal at a selected one of the outputs.

18. A multiplexing circuit as claimed in claim 17, wherein:
the mirrored bias current signals are each substantially equal to the bias current signal,
the mirrored summed current signals are each substantially equal to the summed current signal, and
each output current signal is formed as a difference between a corresponding mirrored summed current signal and a corresponding mirrored bias current signal, such that the output current signal is always substantially equal to the input current signal.

19. A multiplexing circuit as claimed in claim 17, wherein each second current mirror is associated with a corresponding first current mirror.

20. A multiplexing circuit as claimed in claim 17, wherein the first current mirrors provide mirrored summed current signals of an opposite polarity to the mirrored bias current signals provided by the second current mirrors.

21. A multiplexing circuit as claimed in claim 17, wherein the switching unit comprises a plurality of first switches, each of the first switches being associated with a corresponding first current mirror.

22. A multiplexing circuit as claimed in claim 21, wherein the switching unit further comprises a plurality of second switches, each associated with a corresponding second current mirror.

23. A multiplexing circuit as claimed in claim 17, further comprising at least one current-to-voltage converter, each current-to-voltage converter converting a corresponding output current signal to a corresponding output voltage signal.

24. A multiplexing circuit as claimed in claim 17, wherein the second current mirrors are configured to individually provide a mirrored bias current signal which is proportional to the bias current signal.

25. A multiplexing circuit as claimed in claim 17, wherein each first current mirror comprises an NMOS transistor.

26. A multiplexing circuit as claimed in claim 25, wherein the individual gates of the NMOS transistors are connected in common.

27. A multiplexing circuit as claimed in claim 26, wherein the NMOS transistors are biased such that their drain source voltages are identical.

28. A multiplexing circuit as claimed in claim 17, wherein each of the second current mirrors comprises a PMOS transistor.

29. A multiplexing circuit as claimed in claim 28, wherein the PMOS transistors are biased such that their gate source voltages are identical.

30. A multiplexing circuit as claimed in claim 29, wherein the PMOS transistors are biased such that their drain source voltages are identical.

31. A multiplexing circuit as claimed in claim 17, further comprising a controller providing a control signal, wherein the switching circuit performs the selective switching in response to the control signal.

32. A multiplexing circuit as claimed in claim 17, wherein when the mirrored summed current signal and the mirrored bias current signal combine the mirrored bias current signal at least partially cancels the bias current component of the summed current signal.

33. A multiplexing circuit as claimed in claim 32, wherein when the mirrored summed current signal and the mirrored bias current signal combine the mirrored bias current signal fully cancels the bias current component of the summed current signal.

34. A multiplexing circuit as claimed in claim 32, wherein when the mirrored summed current signal and the mirrored bias current signal combine the mirrored bias current signal cancels a portion of the bias current component of the summed current signal.

35. A multiplexing circuit comprising:
a converter that converts an input voltage signal to an input current signal;
a bias current source providing a bias current signal;
a summing node that receives the bias current signal and the input current signal, and provides a resulting summed current signal comprising a sum of the input current signal plus the bias current signal;
a plurality of first current mirrors, each of the first current mirrors being configured to mirror the summed current signal so as to provide an individual mirrored summed current signal;
a plurality of second current mirrors, each of the second current mirrors being configured to mirror the bias current signal so as to provide an individual mirrored bias current signal, wherein each of the second current mirrors is associated with a corresponding one of the first current mirrors;
a plurality of first switches, each individual first switch being associated with a corresponding one of the second current mirrors; and
a controller that selectively operates the first switches and the second switches to connectively combine individual mirrored summed current signals with a corresponding individual mirrored bias current signal to provide an output current signal at a selected one of a plurality of parallel output nodes.

36. A method of multiplexing, the method comprising:
a. converting an input voltage signal to an input current signal;
b. providing a bias current that is summed with the input current signal to form a summed current signal;
c. mirroring the summed current signal with a plurality of first current mirrors;
d. mirroring the bias current signal with a plurality of second current mirrors; and
e. selectively switching individual first current mirrors with corresponding second current mirrors so that the bias current signal mirrored by one of the second current mirrors combines with the summed current signal mirrored by one of the first current mirrors to form an output current signal at a selected one of a plurality of parallel output nodes, wherein each of the output nodes is connectable via the selective switching to a current mirror pair comprising one of the first current mirrors and a corresponding one of the second current mirrors.

37. A multiplexing circuit comprising:
a converter that converts an input voltage signal to an input current signal;
a current source which provides a bias current signal that is summed with the input current signal to form a summed current signal;
a plurality of first current mirrors that mirror the summed current signal;

a plurality of second current mirrors that mirror the bias current signal; and a switching unit that selectively switches one of the first current mirrors with one of the second current mirrors so that the bias current signal mirrored by the one of the second current mirrors combines with the summed current signal mirrored by the one of the first mirrors to form an output current signal at a selected one of a plurality of parallel output nodes, wherein each of the output nodes is connectable via the selective switching to a current mirror pair comprising one of the first current mirrors and a corresponding one of the second current mirrors.

\* \* \* \* \*